United States Patent
Tam et al.

(10) Patent No.: US 9,863,989 B1
(45) Date of Patent: Jan. 9, 2018

(54) CURRENT PROBE FED DIPOLE ARRAY ON DIELECTRIC WATER BOTTLE WITH BRINE WATER LOADING

(71) Applicant: SPAWAR Systems Center Pacific, San Diego, CA (US)

(72) Inventors: Daniel W. Tam, San Diego, CA (US); Marcus L. Maurer, San Diego, CA (US); Randall A. Reeves, San Diego, CA (US)

(73) Assignee: The United States of America as represented by Secretary of the Navy, Washington, DC (US)

( * ) Notice: Subject to any disclaimer, the term of this patent is extended or adjusted under 35 U.S.C. 154(b) by 34 days.

(21) Appl. No.: 15/240,728

(22) Filed: Aug. 18, 2016

(51) Int. Cl.
*G01R 27/04* (2006.01)
*G01R 27/32* (2006.01)
*G01R 23/07* (2006.01)

(52) U.S. Cl.
CPC .............. *G01R 27/32* (2013.01); *G01R 23/07* (2013.01)

(58) Field of Classification Search
CPC .................................. G01R 23/07; G01R 27/32
See application file for complete search history.

(56) References Cited

U.S. PATENT DOCUMENTS

| 1,734,146 A * | 11/1929 | Reynolds | H04B 1/10 |
| | | | 12/142 D |
| 9,495,851 B1 * | 11/2016 | Russell | G06Q 10/00 |
| 2005/0243014 A1 * | 11/2005 | Bryan, Jr. | H01Q 1/36 |
| | | | 343/895 |
| 2006/0145705 A1 * | 7/2006 | Raja | G01R 31/1272 |
| | | | 324/536 |
| 2010/0032437 A1 * | 2/2010 | Lossau | B01L 3/545 |
| | | | 220/694 |
| 2012/0138565 A1 * | 6/2012 | Yu | B65D 23/14 |
| | | | 215/386 |
| 2014/0139224 A1 | 5/2014 | Stolarczyk et al. | |

OTHER PUBLICATIONS

Navy Anenna Using Seawater instead of Metal, https://www.technologyreview.com/s/421741/navy-antenna-using-seawater-instead-of-metal/, Nov. 2010.*

* cited by examiner

*Primary Examiner* — Patrick Assouad
*Assistant Examiner* — Demetrius Pretlow
(74) *Attorney, Agent, or Firm* — SPAWAR Systems Center Pacific; Kyle Eppele

(57) ABSTRACT

A system includes a bottle, a first wire, a second wire, a current probe and an output line. The bottle holds a dielectric liquid therein. The first wire is disposed longitudinally on the bottle and generates a first oscillating electrical current in response to an electromagnetic wave, wherein the first oscillating electrical current thereby generates a corresponding first oscillating magnetic field. The second wire is disposed in parallel with the first wire on the bottle and generates a second oscillating electrical current in response to the electromagnetic wave, wherein the second oscillating electrical current thereby generating a corresponding second oscillating magnetic field. The current probe is arranged to surround the bottle such that the bottle is rotatable within the current probe or such that the current probe is rotatable around the bottle.

20 Claims, 7 Drawing Sheets

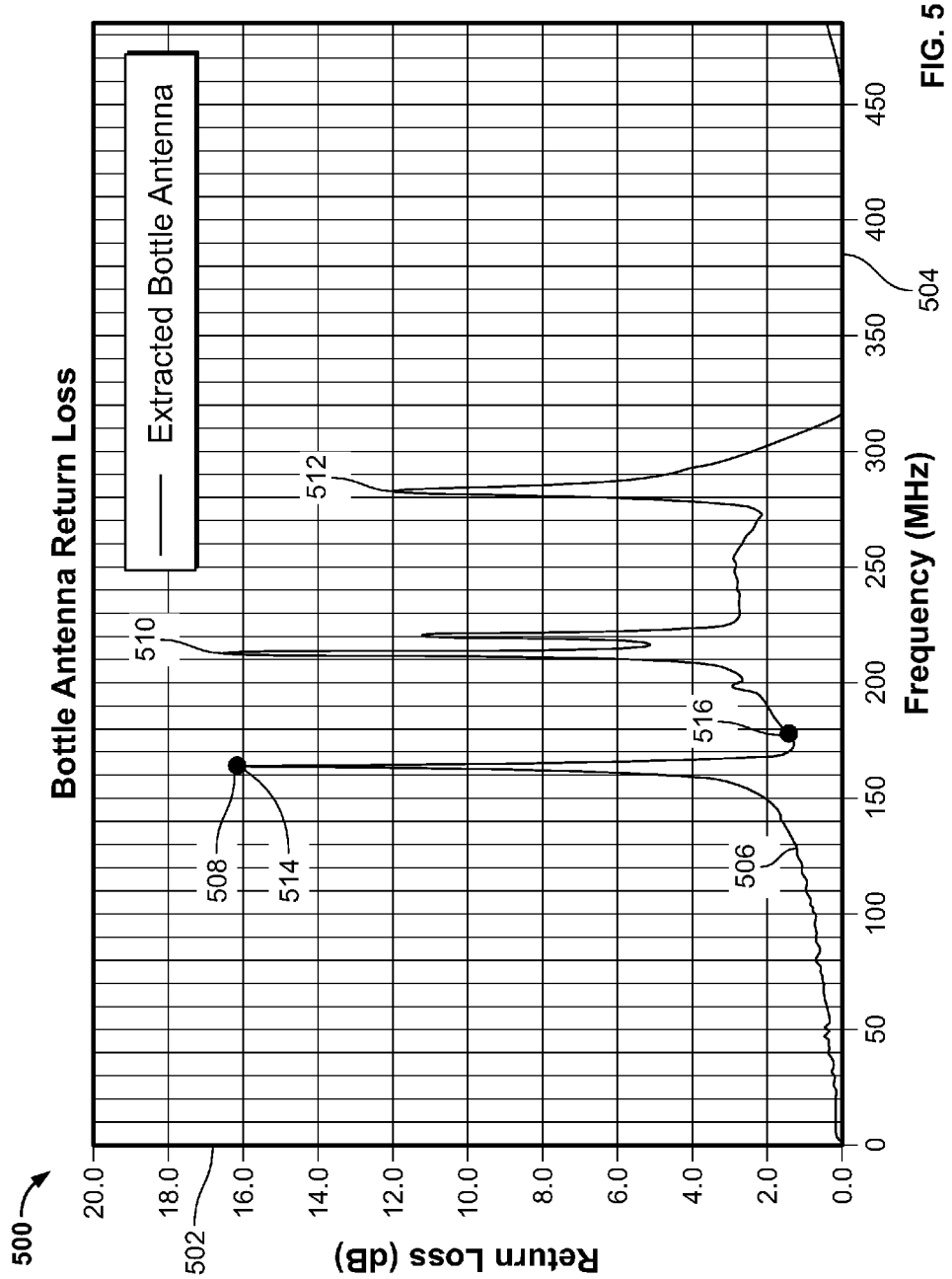

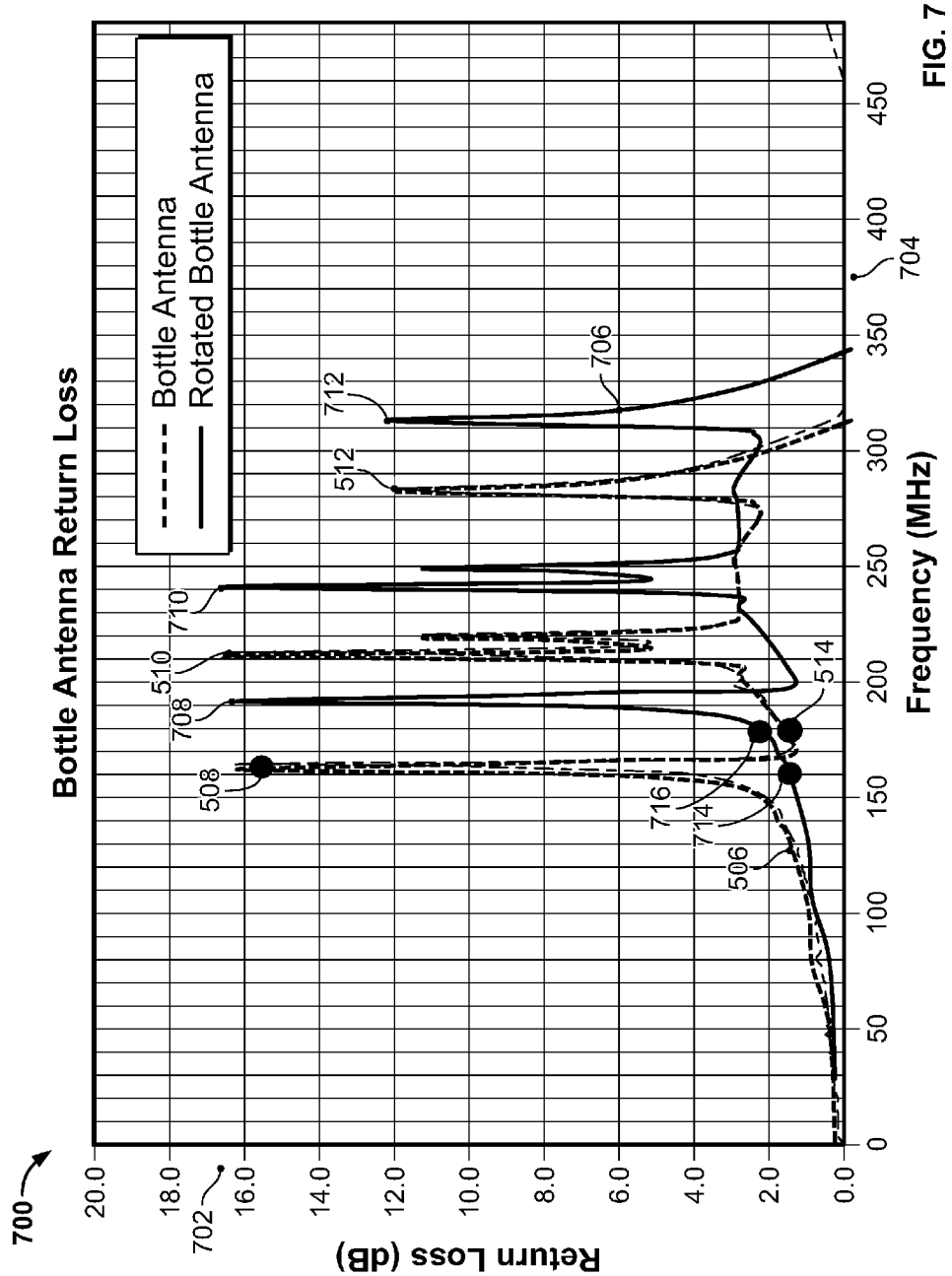

CURRENT PROBE FED DIPOLE ARRAY ON DIELECTRIC WATER BOTTLE WITH BRINE WATER LOADING

STATEMENT OF GOVERNMENT INTEREST FEDERALLY-SPONSORED RESEARCH AND DEVELOPMENT

The United States Government has ownership rights in this invention. Licensing inquiries may be directed to Office of Research and Technical Applications. Space and Naval Warfare Systems Center, Pacific, Code 72120, San Diego, Calif., 92152; telephone (619)553-5118; email: ssc_pac_t2@navy.mil. Reference Navy Case No. 102.715.

BACKGROUND OF THE INVENTION

Embodiments of the invention relate to portable dipole antennas.

A traditional 8 in. dipole antenna has a fundamental frequency of 700 MHz, a third harmonic frequency at 2,100 MHz, and a fifth harmonic frequency at 3,500 MHz. A traditional 165 MHz dipole antenna requires a length of 34 in.

What is needed is a portable dipole antenna that may utilize frequencies of a traditional 165 MHz dipole antenna but with a much smaller length than 34 in.

SUMMARY OF THE INVENTION

An aspect of the present invention is drawn to a system that includes a bottle, a first wire, a second wire, a current probe and an output line. The bottle holds a dielectric liquid therein. The first wire is disposed longitudinally on the bottle and generates a first oscillating electrical current in response to an electromagnetic wave, wherein the first oscillating electrical current thereby generates a corresponding first oscillating magnetic field. The second wire is disposed in parallel with the first wire on the bottle and generates a second oscillating electrical current in response to the electromagnetic wave, wherein the second oscillating electrical current thereby generates a corresponding second oscillating magnetic field. The current probe is arranged to surround the bottle such that the bottle is rotatable within the current probe or such that the current probe is rotatable around the bottle. The output line is connected to the current probe. The current probe outputs an output signal on the output line, wherein the output signal is based on the first oscillating magnetic field and the second oscillating magnetic field. The first wire and the second wire are disposed such that the current probe is operable to receive a first electromagnetic signal having a first resonate frequency and a second electromagnetic signal having a second resonate frequency when the bottle is disposed in a first angular position relative to the current probe output feed point. The first wire and second wire are also disposed such that the current probe is operable to receive a third electromagnetic signal having a third resonate frequency and a fourth electromagnetic signal having a fourth resonate frequency when the bottle is disposed in a second angular position relative to the current probe output feed point.

BRIEF DESCRIPTION OF THE DRAWINGS

The accompanying drawings, which are incorporated in and form a part of the specification, illustrate example embodiments and, together with the description, serve to explain the principles of the invention. In the drawings:

FIG. 5 illustrates a graph of bottle antenna return loss as a function of frequency;

FIG. 7 illustrates another graph of bottle antenna return loss as a function of frequency;

DETAILED DESCRIPTION OF THE EMBODIMENTS

In accordance with aspects of the present invention, a current probe dipole antenna array system is disposed on a water bottle with brine water loading. Such an antenna system has multiple fundamental frequencies. For example, a current probe fed 8" dipole array on a dielectric water bottle with brine water loading has fundamental frequencies as 165 MHz, 212 MHz, 220 MHz, and 280 MHz. These frequencies are not harmonically related. The existence of multiple frequencies are from the current probe electromagnetic induction interaction through the loop winding with the dipoles, dielectric label markings, label marking colors, plastic bottle, and brine water.

The frequencies can be adjusted or tuned by the rotation of the bottle that aligns with dielectric label markings and loop winding of the current probe. This current probe fed dipole array on dielectric water bottle with brine water loading method produced an electrical small antenna. For example, traditional 165 MHz dipole requires a length of 34". On the contrary a system in accordance with aspects of the present invention only requires a length of 8", which is a factor of 4.25 in length reduction. The length reduction is caused by the brine water loading effect, wherein the RF propagation slows down in the brine water.

Aspects of the present invention will now be further described with reference to FIGS. 1-9.

Figure 1:
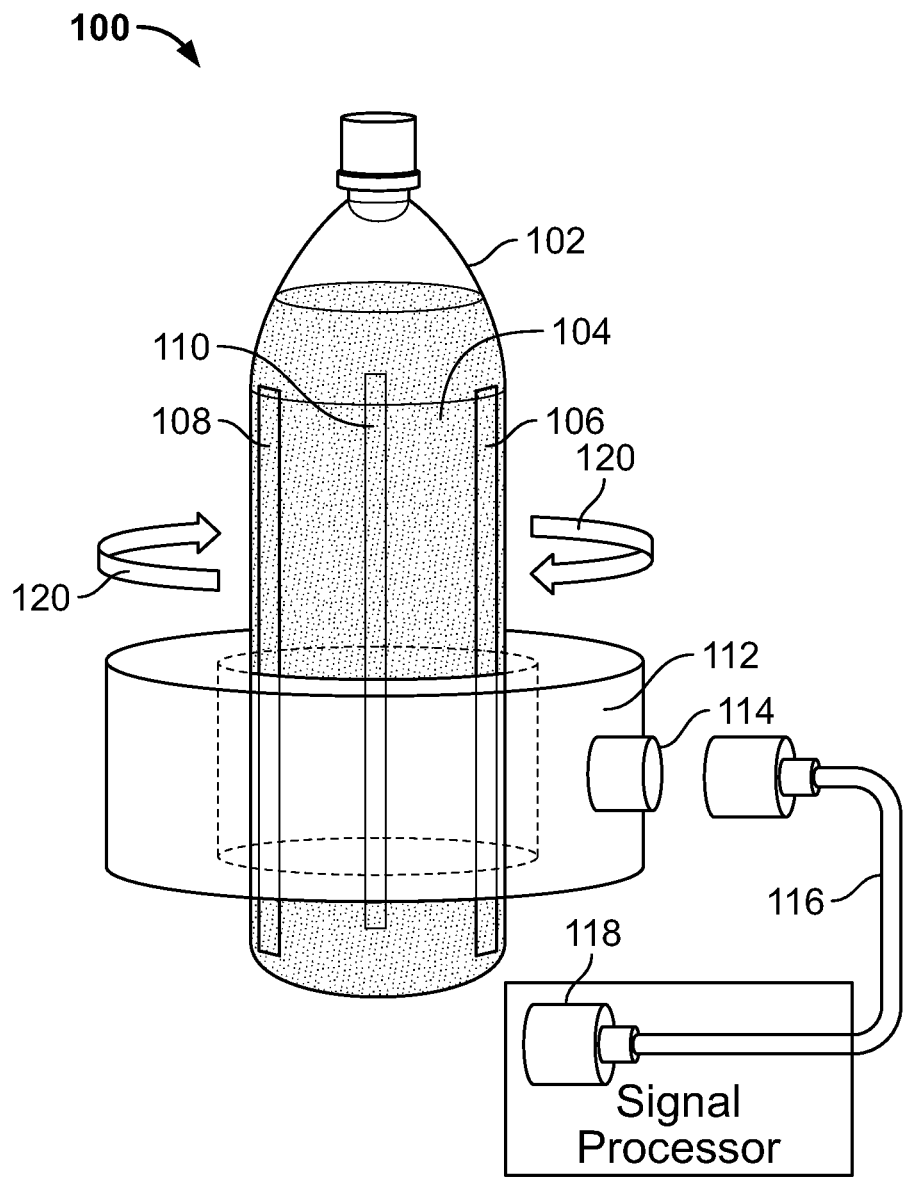
FIG. 1 illustrates an example antenna system in accordance with aspects of the present invention.

FIG. 1 illustrates an example antenna system 100 in accordance with aspects of the present invention.

As shown in the figure, antenna system 100 includes a bottle 102, a dielectric liquid 104, a plurality of wires—a sample of which are indicated as wire 106, wire 108 and wire 110, a current probe 112, an output port 114, an output line 116 and a signal processor 118.

Each of the plurality of wires is longitudinally disposed on bottle 102, wherein each wire is parallel with the others. Current probe 112 is disposed to surround bottle 102, such that bottle 102 is rotatable within current probe 112, or current probe 112 is rotatable around bottle 102, as shown by arrows 120. Output line 116 is electrically connectable to current probe 112 via output port 114.

When used as a receiving antenna, antenna system 100 can receive electromagnetic signals. The received oscillating EM signals will induce oscillating current in wires 106, 108 and 110, which will couple oscillating magnetic fields into current probe 112, which will output an oscillating current at output port 114 to output line 116. The output current is processed by signal processor 118.

The multiple wires on bottle 102 enable a plurality of resonant frequencies for reception. The multiple wires in conjunction with dielectric liquid 104 enables a wire length of 8" as compared to a traditional 165 MHz dipole antenna that requires a length of 34". This aspect of the present invention provides the much needed size reduction for covert use. Further, rotation of bottle 102 enables tuning of the resonant frequencies for reception.

These same benefits may be utilized when used as a transmitting antenna. However, one of skill in the art would recognize that signal processor 118 will provide a driving signal into output port 114 to couple magnetic fields from current probe 112 around each of wires 106, 108 and 110, which will generate currents in each of wires 106, 108 and 110 for EM signal transmission.

More specific operation of example antenna system 100 will now be described with additional reference to FIGS. 2-7.

Figure 2:
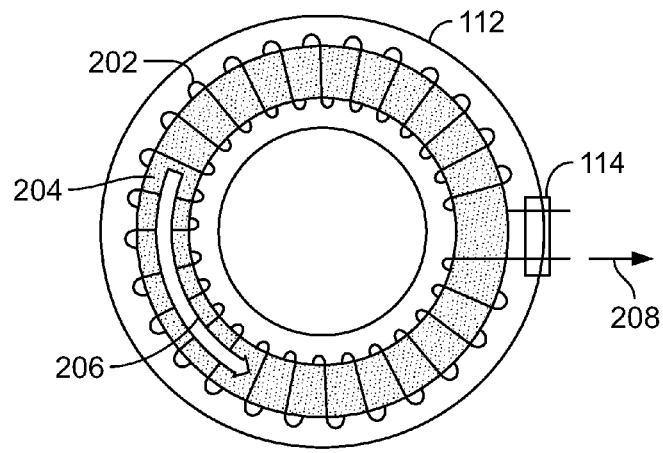
FIG. 2 illustrates a planar view of the inside of the current probe of the antenna system of FIG. 1.

FIG. 2 illustrates a planar view of the inside of current probe 112.

As shown in the figure, current probe 112 includes a wire 202 that is input through output port 114, that winds around a ferromagnetic toroidal core 204 and that returns out through output port 114. A magnetic field 206 that is induced within ferromagnetic toroidal core 204 will generate a current in wire 202 that is output as current 208. Further, any changes to magnetic field 206 will be reflected as changes to current 208.

Similarly, a current 208 that is supplied to wire 202 will induce magnetic field 206. Further, any changes to current 208 will be reflected as changes to magnetic field 206.

The interaction of wires of bottle 102 with current probe 112 will now be described in greater detail with reference to FIG. 3.

Figure 3:
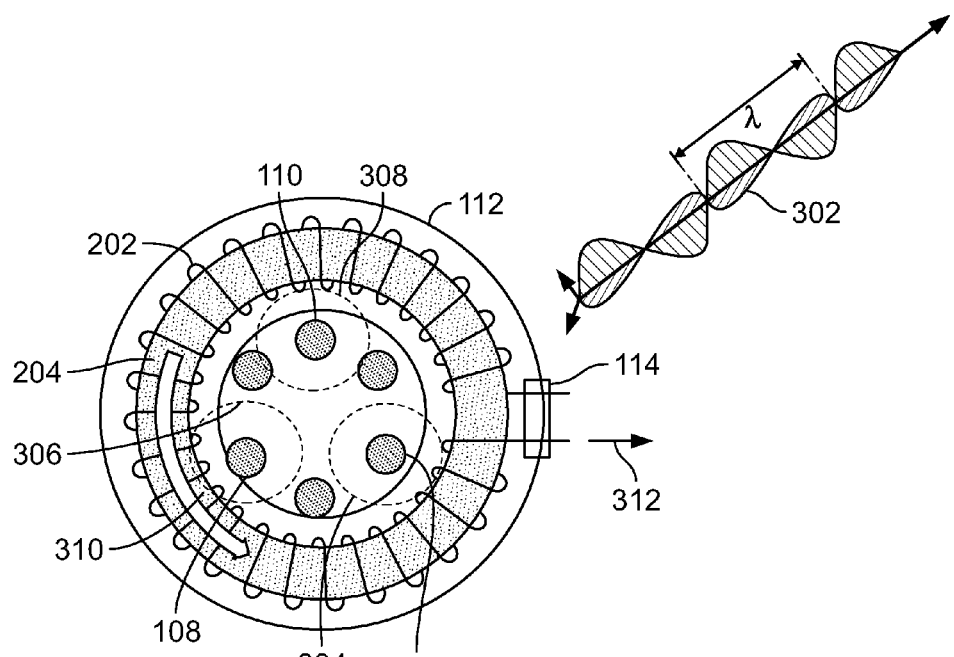
FIG. 3 illustrates a planar view of a cross section of the current probe and bottle of the antenna system of FIG. 1 in the presence of an electromagnetic (EM) wave having a wavelength A.

FIG. 3 illustrates a planar view of a cross section of current probe 112 and bottle 102 in the presence of an electromagnetic (EM) wave 302 having a wavelength $\lambda$.

As shown in the figure, EM wave 302 induces oscillating currents within each of the plurality of wires on bottle 102. For purposes of discussion and simplicity, only currents within wires 106, 108 and 110 will be discussed.

The induced oscillating current in wire 106 will create a concentric oscillating magnetic field 304 in accordance with the well-known right hand rule. In a similar fashion, the induced oscillating current in wire 108 will create a concentric oscillating magnetic field 306, whereas the induced oscillating current in wire 110 will create a concentric oscillating magnetic field 308. The created oscillating magnetic fields 106, 108 and 110 will couple to ferromagnetic toroidal core 204 and will alter the magnetic field therein to create oscillating magnetic field 310. Oscillating magnetic field 310 will then induce a corresponding oscillating current within wire 202 to be output as current 312.

Brine solution 104 has dielectric properties to alter the speed at which an EM wave travels through bottle 102. Further, the dielectric properties of brine solution 104 alter the path of a wavefront of an EM wave as it passes into bottle 102 in accordance with Snell's law. The combination of these two effects dictates each induced oscillating current generated the plurality of wires on bottle 102 at any given time. Further, with respect to the path of a wavefront of an EM wave as it passes through bottle 102, induced oscillating currents generated within each of the plurality of wires on bottle 102 at any given time will be a function of the wavelength of the EM wave. For purposes of discussion and simplicity, only currents within wires 106, 108 and 110 will be discussed. This will be described with reference to FIGS. 4A-B.

Figure 4A:
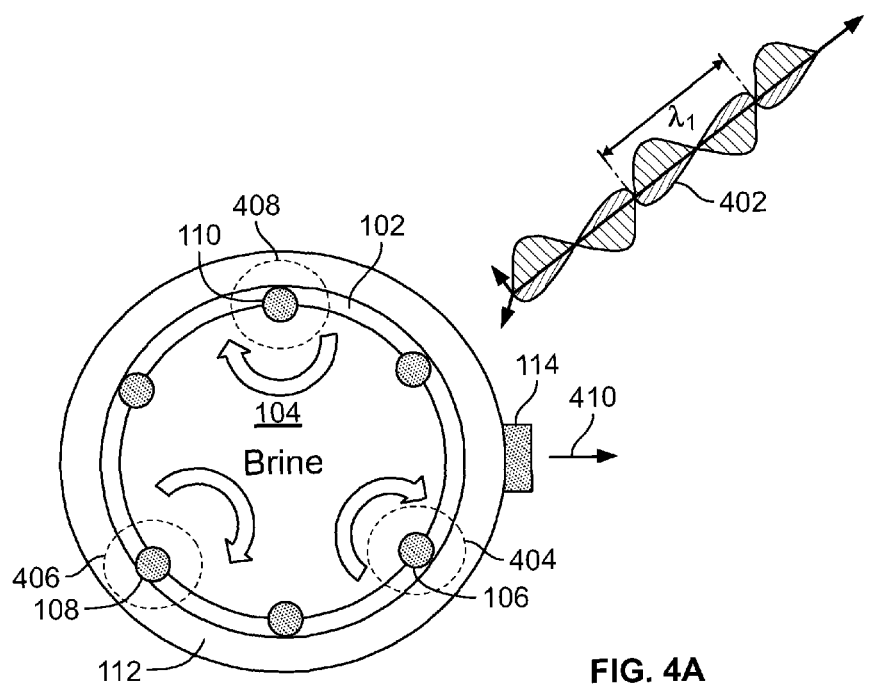
FIG. 4A illustrates a planar view of a cross section of the current probe and bottle of the antenna system of FIG. 11 in the presence of an EM wave having a wavelength $\lambda_1$.

FIG. 4A illustrates a planar view of a cross section of current probe 112 and bottle 102 in the presence of an EM wave 402 having a wavelength $\lambda_1$.

In this example, presume that at a time $t_1$, EM wave 402: induces a current in wire 106 that generates a corresponding concentric clock-wise rotating magnetic field 404; induces a current in wire 108 that generates a corresponding concentric clock-wise rotating magnetic field 404; and induces a current in wire 110 that generates a corresponding concentric clock-wise rotating magnetic field 408. Again, there will also be currents and corresponding magnetic fields in other wires on bottle 102. However, these will not be discussed for brevity.

Concentric clock-wise rotating magnetic fields 404, 406 and 408 will couple to ferromagnetic toroidal core 204 (not shown) in current probe 112. The coupled magnetic field within ferromagnetic toroidal core 204 will generate a current in wire 202 (not shown) in current probe 112 that is output through output port 114 as a current 410.

Here, the amount of current generated at each wire is dependent upon the instantaneous change of EM wave 402 at time $t_1$. In short, a different phase of EM wave 402 will be hitting each of the wires, including wires 106, 108 and 110 at time $t_1$. As such, each wire will be generating its own respective current magnitude and polarity, and therefore its own respective magnetic field magnitude and polarity. The superposition of all generated magnetic fields at time $t_1$ will therefore contribute to the coupled magnetic field into ferromagnetic toroidal core 204.

If the frequency of the EM wave is different, then the path of a wavefront of new EM wave as it passes through bottle 102 will change. Such a change in the wavefront path will therefore change the phase of the new EM wave as it hits each of the wires at an instant of time. This will be described in greater detail with reference to FIG. 4B.

Figure 4B:
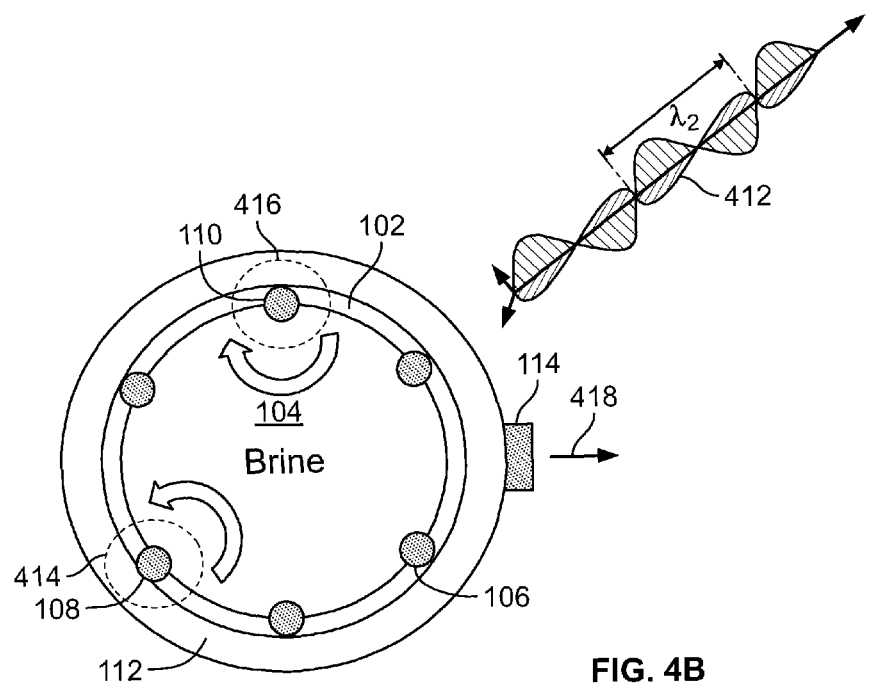
FIG. 4B illustrates a planar view of a cross section of the current probe and bottle of the antenna system of FIG. 1 in the presence of an EM wave having a wavelength $\lambda_2$.

FIG. 4B illustrates a planar view of a cross section of current probe 112 and bottle 102 in the presence of an EM wave 412 having a wavelength $\lambda_2$.

In this example, presume that at a time $t_2$, EM wave 412: induces no current in wire 106; induces a current in wire 108 that generates a corresponding concentric counter clock-wise rotating magnetic field 414; and induces a current in wire 110 that generates a corresponding concentric clock-wise rotating magnetic field 416. Again, there will also be currents and corresponding magnetic fields in other wires on bottle 102. However, these will not be discussed for brevity.

In this example, concentric counter clock-wise rotating magnetic field 414 couples to ferromagnetic toroidal core 204 (not shown) in current probe 112. Further, concentric clock-wise rotating magnetic field 416 couples to ferromagnetic toroidal core 204 (not shown) in current probe 112 in a manner so as to negatively interfere with the coupling of counter clock-wise rotating magnetic field 414. The final coupled magnetic field within ferromagnetic toroidal core 204 will generate a current in wire 202 (not shown) in current probe 112 that is output through output port 114 as a current 418.

Similar to the situation discussed above with reference to FIG. 4A, here the amount of current generated at each wire is dependent upon the instantaneous change of EM wave 412 at time $t_2$. A different phase of EM wave 412 will be hitting each of the wires, including wires 106, 108 and 110 at time $t_1$. As such, each wire will be generating its own respective current magnitude and polarity, and therefore its own respective magnetic field magnitude and polarity. The superposition of all generated magnetic fields at time $t_1$ will therefore contribute to the coupled magnetic field into ferromagnetic toroidal core 204.

In light of the discussion of FIGS. 4A-B, there are times where the resonant frequency of antenna system 100 will have a minimized loss, wherein the combined contributions of all generated magnetic fields minimally negatively affect one another. Similarly, there are times where the resonant frequency of antenna system 100 will have a maximized loss, wherein the combined contributions of all generated magnetic fields maximally negatively affect one another. This will be further described with reference to FIG. 5.

FIG. 5 illustrates a graph 500 of bottle antenna return loss as a function of frequency.

As shown in the figure, graph 500 includes a y-axis 502 for return loss in dB, an x-axis 504 of frequency and a function 506. Function 506 includes three spikes 508, 510 and 512. Here the return loss (y-axis) corresponds to an amount of signal that is reflected back from the antenna so as not to be detected by single processor 118 of FIG. 1. Here the higher the return loss, the better overall performance of the antenna.

Spikes 508, 510 and 512 correspond to resonant frequencies of EM signals wherein the reflected loss of antenna system 100 is minimized. In other words, the performance of antenna system 100 is maximized at these three EM frequencies. For purposes of discussion, let EM signal 402 of FIG. 4A correspond to a point 514 on graph 500 and let EM signal 412 of FIG. 4B correspond to a point 516 on graph 500. In such a case, it is clear that antenna system 100 will receive EM signal 402 with much less loss than EM signal 412.

As mentioned previously, the path of a wavefront of an EM wave as it passes through bottle 102 induces oscillating currents generated within each of the plurality of wires on bottle 102 at any given time will be a function of the wavelength of the EM wave. This path may be modified by rotating bottle 102 relative to current probe 112 or by rotating current probe 112 relative to bottle 102. This will be further described with reference to FIGS. 6A-7.

Figure 6A:
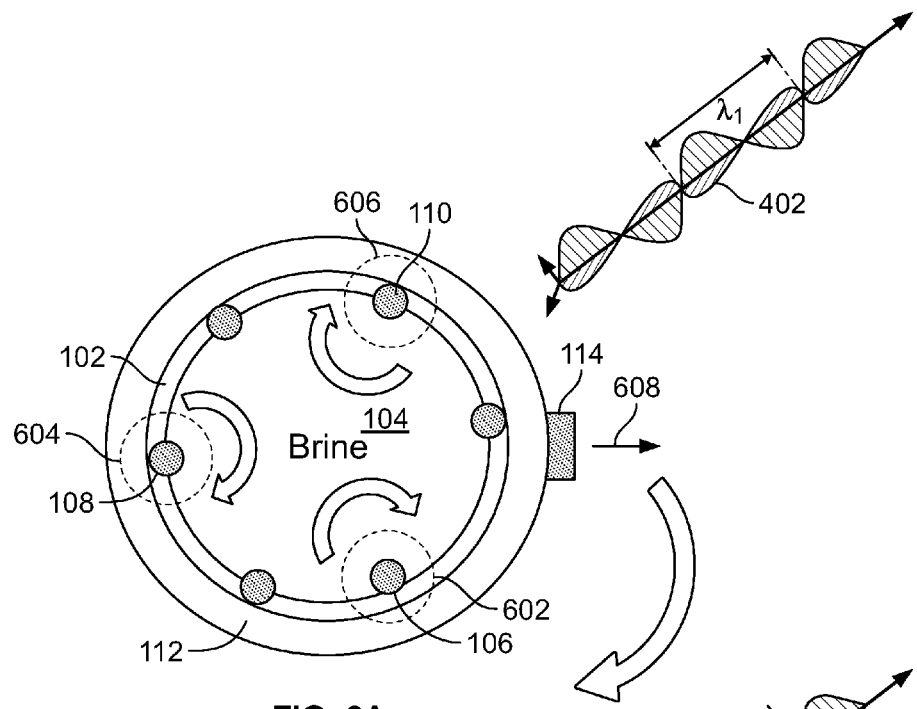
FIG. 6A illustrates a planar view of a cross section of the current probe and bottle of the antenna system of FIG. 1 in the presence of an EM wave having a wavelength $\lambda_1$, wherein the bottle is rotated clockwise with reference to the current probe as compared to that of FIG. 4A.

FIG. 6A illustrates a planar view of a cross section of current probe 112 and bottle 102 in the presence of an EM wave 402 having a wavelength $\lambda_1$, wherein bottle 102 is rotated clockwise with reference to current probe 112 as compared to that of FIG. 4A.

In this example, presume that at a time $t_3$, EM wave 402: induces a current in wire 106 that generates a corresponding concentric clock-wise rotating magnetic field 602; induces a current in wire 108 that generates a corresponding concentric clock-wise rotating magnetic field 604; and induces a current in wire 110 that generates a corresponding concentric clock-wise rotating magnetic field 606. Again, there will also be currents and corresponding magnetic fields in other wires on bottle 102. However, these will not be discussed for brevity.

Concentric clock-wise rotating magnetic fields 602, 604 and 606 will couple to ferromagnetic toroidal core 204 (not shown) in current probe 112. The coupled magnetic field within ferromagnetic toroidal core 204 will generate a current in wire 202 (not shown) in current probe 112 that is output through output port 114 as a current 608.

As mentioned earlier, the amount of current generated at each wire is dependent upon the instantaneous change of EM wave 402 at time $t_1$. Again, the superposition of all generated magnetic fields at time $t_1$ will therefore contribute to the coupled magnetic field into ferromagnetic toroidal core 204. It should be noted that the magnetic fields are different than those discussed above with reference to FIG. 4A. This is attributed to difference in the path of a wavefront of EM wave 402 as it passes through bottle 102, now that bottle 102 has been rotated.

Further, as noted previously, if the frequency of the EM wave is different, then the path of a wavefront of new EM wave as it passes through bottle 102 will change. This will be described in greater detail with reference to FIG. 6B.

Figure 6B:
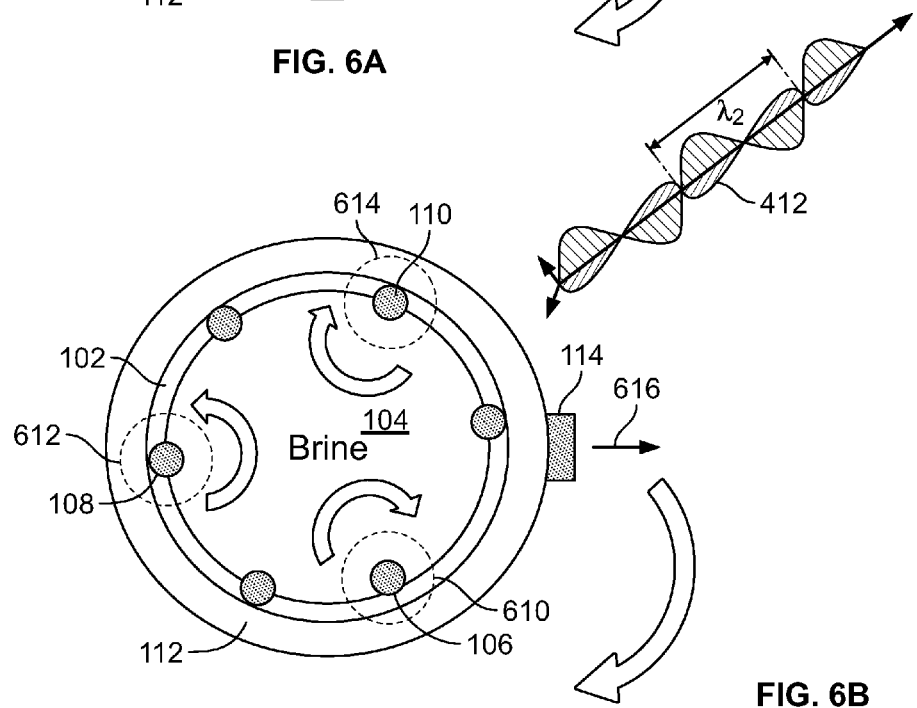
FIG. 6B illustrates a planar view of a cross section of the current probe and bottle of the antenna system of FIG. 1 in the presence of an EM wave having a wavelength $\lambda_2$, wherein the bottle is rotated clockwise with reference to the current probe as compared to that of FIG. 4B.

FIG. 6B illustrates a planar view of a cross section of current probe 112 and bottle 102 in the presence of an EM wave 412 having a wavelength $\lambda_2$, wherein bottle 102 is rotated clockwise with reference to current probe 112 as compared to that of FIG. 4A.

In this example, presume that at a time $t_2$, EM wave 412: induces a current in wire 106 that generates a corresponding concentric counter clock-wise rotating magnetic field 610; induces a current in wire 108 that generates a corresponding concentric counter clock-wise rotating magnetic field 612; and induces a current in wire 110 that generates a corresponding concentric clock-wise rotating magnetic field 614. Again, there will also be currents and corresponding magnetic fields in other wires on bottle 102. However, these will not be discussed for brevity.

In this example, concentric counter clock-wise rotating magnetic fields 610 and 612 couple to ferromagnetic toroidal core 204 (not shown) in current probe 112. Further, concentric clock-wise rotating magnetic field 616 couples to ferromagnetic toroidal core 204 (not shown) in current probe 112 in a manner so as to negatively interfere with the coupling of counter clock-wise rotating magnetic fields 610 and 612. The final coupled magnetic field within ferromagnetic toroidal core 204 will generate a current in wire 202 (not shown) in current probe 112 that is output through output port 114 as a current 616.

Again, there are times where the resonant frequency of antenna system 100 in the rotated configuration of FIGS. 6A-B will have a minimized loss, and times where the resonant frequency will have a maximized loss. The comparison of these minimized and maximized losses can be compared with those of the configuration of FIGS. 4A-B. This will be further described with reference to FIG. 7.

FIG. 7 illustrates a graph 700 of bottle antenna return loss as a function of frequency.

As shown in the figure, graph 700 includes a y-axis 702 for return loss in dB, an x-axis 704 of frequency, function 506 and a function 706. Function 706 includes three spikes 708, 710 and 712. Again, the return loss (y-axis) corresponds to an amount of signal that is reflected back from the antenna so as not to be detected by single processor 118 of FIG. 1. Here the higher the return loss, the better overall performance of the antenna.

Spikes 708, 710 and 712 correspond to resonant frequencies of EM signals wherein the reflected loss of antenna system 100 in the rotated configuration of FIGS. 6A-B is minimized. In other words, the performance of antenna system 100 in the rotated configuration of FIGS. 6A-B is maximized at these three EM frequencies. For purposes of discussion, let EM signal 402 of FIG. 6A correspond to a point 714 on graph 700 and let EM signal 412 of FIG. 4B correspond to a point 716 on graph 700. In such a case, antenna system 100 in the rotated configuration of FIGS. 6A-B will receive EM signal 402 with a little greater loss than EM signal 412. Nevertheless, antenna system 100 in the rotated configuration of FIG. 6A will receive EM signal 402 with a much greater loss than EM signal 402 in as received in the configuration of FIG. 4A.

More importantly, one will note that antenna system 100 may "scan" through the frequency spectrum by merely rotating bottle 102 or current probe 112. The multiple wires on bottle 102 may be used as markings for rotation relative to current probe 112, for example by using output port 114 as a frame of reference. Further, in some embodiments, other markings may be added to bottle 102, such that one frequency marking on the bottle may be aligned with a predetermined portion of current probe 112, wherein a predetermined resonate frequency may be received (or transmitted in the case that antenna system 100 is used for transmission) and such that such that a different frequency marking on the bottle may be aligned with the predetermined portion of current probe 112, wherein a second predetermined resonate frequency may be received (or transmitted in the case that antenna system 100 is used for transmission).

Performance of an example antenna system similar in construction to example antenna system 100 will now be described with additional reference to FIGS. 8-9.

Figure 8:
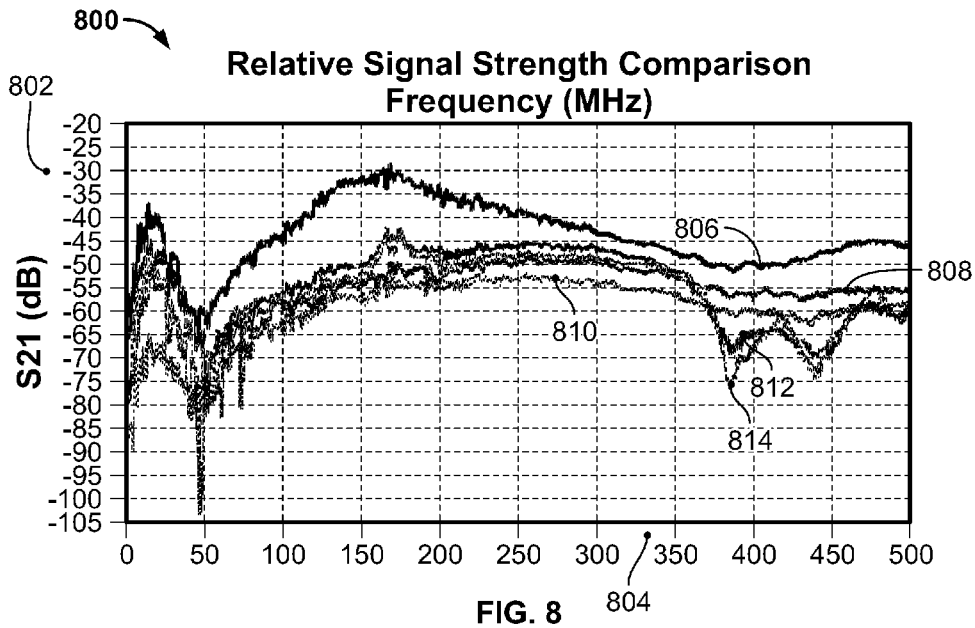
FIG. 8 illustrates a graph of relative signal strength as a function of frequency.

FIG. 8 illustrates a graph 800 of relative signal strength as a function of frequency.

As shown in the figure, graph 800 includes a y-axis 802 for signal strength in dB, an x-axis 804 of frequency and functions 806, 808, 810, 812 and 814.

Function 806 corresponds to a 165 MHz calibration monopole antenna having a length of 9", a diameter of 0.125" and a ground plane dimension of 8.0625"×8.0625"×1.0625". Function 808 corresponds to a brass cylinder antenna having an inner diameter of 1.875". an outer diameter of 2.0" and a height of 9.0".

Functions 810, 812 and 814 correspond to an antenna system similar in construction to example antenna system 100, wherein the outer diameter of the bottle is 2.9375", the height of the bottle is 11.5", the current probe inner diameter is 3", the current probe outer diameter is 6" and the current probe height is 2". Multiple test were performed wherein the length of wire ranges from 8.3125"-8.375", the diameter of wire were one of 0.1875", 0.3125" and 0.375", and the separation angles between each wire were 45°, 60°, 65°, 55°, 50° and 85°.

One will note from graph 800 that the performance of a bottle antenna system in accordance with aspects of the present invention provides similar performance to the brass cylinder antenna (as shown in function 808), a somewhat less performance to the 9" monopole antenna (as shown in function 806). However, to achieve the covert appearance, the present invention employs a bottle to achieve such performance.

Figure 9:
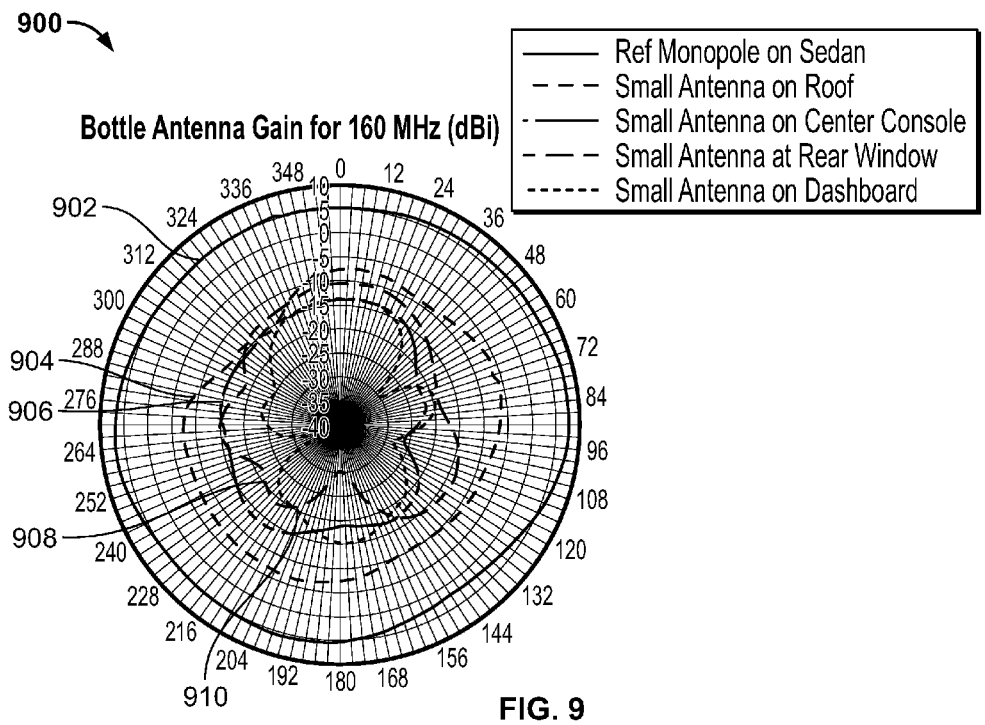
FIG. 9 illustrates a polar graph of gain for a plurality of antennas at 160 MHz.

FIG. 9 illustrates a polar graph 900 of gain for a plurality of antennas at 160 Mhz.

As shown in the figure, in graph 900, angle coordinates correspond to an approaching vector of an EM wavefront and the radial coordinates corresponds to gain. Graph 900 includes functions 902, 904, 906, 908 and 910. Function 902 is the gain profile for a reference monopole antenna disposed on the roof of a sedan. Function 904 is the gain profile for an antenna in accordance with aspects of the present invention disposed on the roof of a sedan. Function 906 is the gain profile for an antenna in accordance with aspects of the present invention disposed on the center console of a sedan. Function 908 is the gain profile for an antenna in accordance with aspects of the present invention disposed near the rear window of a sedan. Function 910 is the gain profile for an antenna in accordance with aspects of the present invention disposed on the dashboard of a sedan.

One will note from graph 900 that the performance of a bottle antenna system in accordance with aspects of the present invention on the roof of a sedan only provides about 15 dB less gain than the monopole antenna. Again, to achieve the covert appearance, the present invention employs a bottle to achieve such performance.

The example embodiments discussed above employ six wires on a bottle. It should be noted that this is a non-limiting example, wherein any number of wires greater than one may be used. Further, in an example embodiment, the dielectric material used in a bottle is a brine solution. It should be noted that any dielectric material may be used.

The foregoing description of various preferred embodiments have been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A system comprising:
   a bottle operable to hold a dielectric liquid therein;
   a first wire disposed longitudinally on said bottle, said first wire being operable to generate a first oscillating electrical current in response to an electromagnetic wave, the first oscillating electrical current thereby generating a corresponding first oscillating magnetic field;
   a second wire disposed in parallel with said first wire on said bottle, said second wire being operable to generate a second oscillating electrical current in response to the electromagnetic wave, the second oscillating electrical current thereby generating a corresponding second oscillating magnetic field;
   a current probe being arranged to surround said bottle such that said bottle is rotatable within said current probe; and
   an output line connected to said current probe,
   wherein said current probe is operable output an output signal on said output line, the output signal being based on the first oscillating magnetic field and the second oscillating magnetic field, and
   wherein said first wire and said second wire are disposed such that said current probe is operable to receive a first electromagnetic signal having a first resonate frequency and a second electromagnetic signal having a second resonate frequency when said bottle is disposed in a first angular position relative to said current probe and such that said current probe is operable to receive a third electromagnetic signal having a third resonate frequency and a fourth electromagnetic signal having a fourth resonate frequency when said bottle is disposed in a second angular position relative to said current probe.

2. The system of claim 1, wherein said current probe comprises a ferromagnetic core and a conductive winding.

3. The system of claim 2, wherein said first wire and said second wire are the same length.

4. The system of claim 3, further comprising:
a first frequency marking disposed on said bottle; and
a second frequency marking disposed on said bottle,
wherein when said bottle is arranged such that said first frequency marking is aligned with a predetermined portion of said current probe, said current probe is operable to receive the first electromagnetic signal having the first resonate frequency and the second electromagnetic signal having the second resonate frequency, and
wherein when said bottle is arranged such that said second frequency marking is aligned with the predetermined portion of said current probe, said current probe is operable to receive the third electromagnetic signal having the third resonate frequency and the fourth electromagnetic signal having the fourth resonate frequency.

5. The system of claim 4, further comprising said dielectric liquid within said bottle.

6. The system of claim 5, wherein said dielectric liquid comprises salt water.

7. The system of claim 6, further comprising a signal processor arranged to receive a signal provided by said output line.

8. The system of claim 1, wherein said first wire and said second wire are the same length.

9. The system of claim 8, further comprising:
a first frequency marking disposed on said bottle; and
a second frequency marking disposed on said bottle,
wherein when said bottle is arranged such that said first frequency marking is aligned with a predetermined portion of said current probe, said current probe is operable to receive the first electromagnetic signal having the first resonate frequency and the second electromagnetic signal having the second resonate frequency, and
wherein when said bottle is arranged such that said second frequency marking is aligned with the predetermined portion of said current probe, said current probe is operable to receive the third electromagnetic signal having the third resonate frequency and the fourth electromagnetic signal having the fourth resonate frequency.

10. The system of claim 9, further comprising said dielectric liquid within said bottle.

11. The system of claim 10, wherein said dielectric liquid comprises salt water.

12. The system of claim 11, further comprising a signal processor arranged to receive a signal provided by said output line.

13. The system of claim 1, further comprising:
a first frequency marking disposed on said bottle; and
a second frequency marking disposed on said bottle,
wherein when said bottle is arranged such that said first frequency marking is aligned with a predetermined portion of said current probe, said current probe is operable to receive the first electromagnetic signal having the first resonate frequency and the second electromagnetic signal having the second resonate frequency, and
wherein when said bottle is arranged such that said second frequency marking is aligned with the predetermined portion of said current probe, said current probe is operable to receive the third electromagnetic signal having the third resonate frequency and the fourth electromagnetic signal having the fourth resonate frequency.

14. The system of claim 13, further comprising said dielectric liquid within said bottle.

15. The system of claim 14, wherein said dielectric liquid comprises salt water.

16. The system of claim 15, further comprising a signal processor arranged to receive a signal provided by said output line.

17. The system of claim 1, further comprising said dielectric liquid within said bottle.

18. The system of claim 17, wherein said dielectric liquid comprises salt water.

19. A system comprising:
a bottle operable to hold a dielectric liquid therein;
a first wire disposed longitudinally on said bottle, said first wire being operable to generate a first oscillating electrical current in response to an electromagnetic wave, the first oscillating electrical current thereby generating a corresponding first oscillating magnetic field;
a second wire disposed in parallel with said first wire on said bottle, said second wire being operable to generate a second oscillating electrical current in response to the electromagnetic wave, the second oscillating electrical current thereby generating a corresponding second oscillating magnetic field;
a current probe being arranged to surround said bottle such that said bottle is rotatable within said current probe or said current probe is rotatable around said bottle;
an output line connected to said current probe; and
a signal processor arranged to receive a signal provided by said output line,
wherein said current probe is operable output an output signal on said output line, the output signal being based on the first oscillating magnetic field and the second oscillating magnetic field, and
wherein said first wire and said second wire are disposed such that said current probe is operable to receive a first electromagnetic signal having a first resonate frequency and a second electromagnetic signal having a second resonate frequency when said bottle is disposed in a first angular position relative to said current probe and such that said current probe is operable to receive a third electromagnetic signal having a third resonate frequency and a fourth electromagnetic signal having a fourth resonate frequency when said bottle is disposed in a second angular position relative to said current probe.

20. A method comprising:
providing a bottle operable to hold a dielectric liquid therein;
disposing, longitudinally on the bottle, a first wire operable to generate a first oscillating electrical current in response to an electromagnetic wave, the first oscillating electrical current thereby generating a corresponding first oscillating magnetic field;
disposing, on the bottle, a second wire in parallel with said first wire, the second wire being operable to generate a second oscillating electrical current in response to the electromagnetic wave, the second oscillating electrical current thereby generating a corresponding second oscillating magnetic field;

arranging a current probe to surround the bottle such that the bottle is rotatable within the current probe or the current probe is rotatable around the bottle; and outputting, via the current probe, an output signal on an output line connected to the current probe, the output signal being based on the first oscillating magnetic field and the second oscillating magnetic field, wherein the first wire and the second wire are disposed such that the current probe is operable to receive a first electromagnetic signal having a first resonate frequency and a second electromagnetic signal having a second resonate frequency when the bottle is disposed in a first angular position relative to the current probe and such that the current probe is operable to receive a third electromagnetic signal having a third resonate frequency and a fourth electromagnetic signal having a fourth resonate frequency when the bottle is disposed in a second angular position relative to the current probe.

* * * * *